United States Patent
Wu et al.

(10) Patent No.: US 11,011,702 B2
(45) Date of Patent: May 18, 2021

(54) MEMORY DEVICES AND METHODS FOR FORMING THE SAME

(71) Applicant: Winbond Electronics Corp., Taichung (TW)

(72) Inventors: Bo-Lun Wu, Tianzhong Township, Changhua County (TW); Shih-Ning Tsai, Taichung (TW); Po-Yen Hsu, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/534,608

(22) Filed: Aug. 7, 2019

(65) Prior Publication Data

US 2021/0043836 A1 Feb. 11, 2021

(51) Int. Cl.
*H01L 45/00* (2006.01)
(52) U.S. Cl.
CPC .......... *H01L 45/1253* (2013.01); *H01L 45/08* (2013.01); *H01L 45/1233* (2013.01); *H01L 45/1608* (2013.01); *H01L 45/146* (2013.01)
(58) Field of Classification Search
None
See application file for complete search history.

(56) References Cited

U.S. PATENT DOCUMENTS

| | | | |
|---|---|---|---|
| 9,577,191 B2 | 2/2017 | Dang et al. | |
| 9,653,682 B1 * | 5/2017 | Chou | H01L 45/16 |
| 9,685,604 B2 | 6/2017 | Huang et al. | |
| 9,847,481 B2 | 12/2017 | Chang et al. | |
| 9,978,938 B2 | 5/2018 | Trinh et al. | |
| 10,176,866 B1 | 1/2019 | Trinh et al. | |
| 2007/0120210 A1 | 5/2007 | Yuan et al. | |
| 2009/0184396 A1 | 7/2009 | Kim et al. | |
| 2011/0227026 A1 | 9/2011 | Sekar et al. | |
| 2013/0075686 A1 | 3/2013 | Kawasaki | |
| 2014/0024197 A1 | 1/2014 | Kawashima et al. | |
| 2014/0197368 A1 | 7/2014 | Yoneda et al. | |
| 2014/0203236 A1 | 7/2014 | Chen et al. | |

FOREIGN PATENT DOCUMENTS

| | | |
|---|---|---|
| CN | 106549102 A | 3/2017 |
| JP | 2008021765 A | 1/2008 |
| JP | 2010140530 A | 6/2010 |
| TW | 201729443 A | 8/2017 |

* cited by examiner

*Primary Examiner* — Robert K Carpenter
(74) *Attorney, Agent, or Firm* — Muncy, Geissler, Olds & Lowe, P.C.

(57) ABSTRACT

A memory device includes a first electrode, a resistive switching layer, a cap layer, a protective layer, and a second electrode. The resistive switching layer is disposed over the first electrode. The cap layer is disposed over the resistive switching layer, wherein the bottom surface of the cap layer is smaller than the top surface of the resistive switching layer. The protective layer is disposed over the resistive switching layer and surrounds the cap layer. At least a portion of the second electrode is disposed over the cap layer and covers the protective layer.

19 Claims, 9 Drawing Sheets

MEMORY DEVICES AND METHODS FOR FORMING THE SAME

BACKGROUND

Technical Field

The present disclosure relates to semiconductor manufacturing, and in particular it relates to memory devices and methods for forming the same.

Description of the Related Art

As semiconductor devices are gradually miniaturized, the difficulty of manufacturing these semiconductor devices increases dramatically, and undesired defects may occur during the manufacturing process, which may cause degradation or damage to the device. Therefore, semiconductor devices must be continuously improved to increase the yield and improve the process window.

BRIEF SUMMARY

The present disclosure discloses memory devices and methods for forming the same, and is particularly applicable to non-volatile memory devices, such as a resistive random-access memory (RRAM) device.

In accordance with some embodiments of the present disclosure, a memory device is provided. The memory device includes a resistive switching layer disposed over a first electrode; a cap layer disposed over the resistive switching layer, wherein the bottom surface of the cap layer is smaller than the top surface of the resistive switching layer; a protective layer disposed over the resistive switching layer and surrounding the cap layer; and a second electrode, at least a portion of which is disposed over the cap layer and covering the protective layer.

In accordance with some embodiments of the present disclosure, a method of forming memory devices is provided. The method includes forming a first electrode; forming a resistive switching layer over the first electrode; forming a cap layer over the resistive switching layer, wherein the bottom surface of the cap layer is smaller than the top surface of the resistive switching layer; forming a protective layer over the resistive switching layer, wherein the protective layer surrounds the cap layer; forming a second electrode over the cap layer, wherein the second electrode covers the protective layer; forming a mask layer over the second electrode; and performing an etching process using the mask layer as an etch mask so that sidewalls of the first electrode, the resistive switching layer, the cap layer, the protective layer, the second electrode, and the mask layer are coplanar.

Based on the above, the present disclosure can provide a protective layer surrounding the cap layer in the memory device to avoid damage to the cap layer in subsequent processes, thereby improving the reliability of the memory devices and increasing the process window.

To make the above-described features and advantages of the present disclosure more apparent, the following embodiments are described in detail below with reference to the accompanying figures. In order to simplify the description, repeated reference numerals and/or letters may be used in different embodiments, which are not intended to limit the relationship between the different embodiments.

DETAILED DESCRIPTION

Figure 1A:
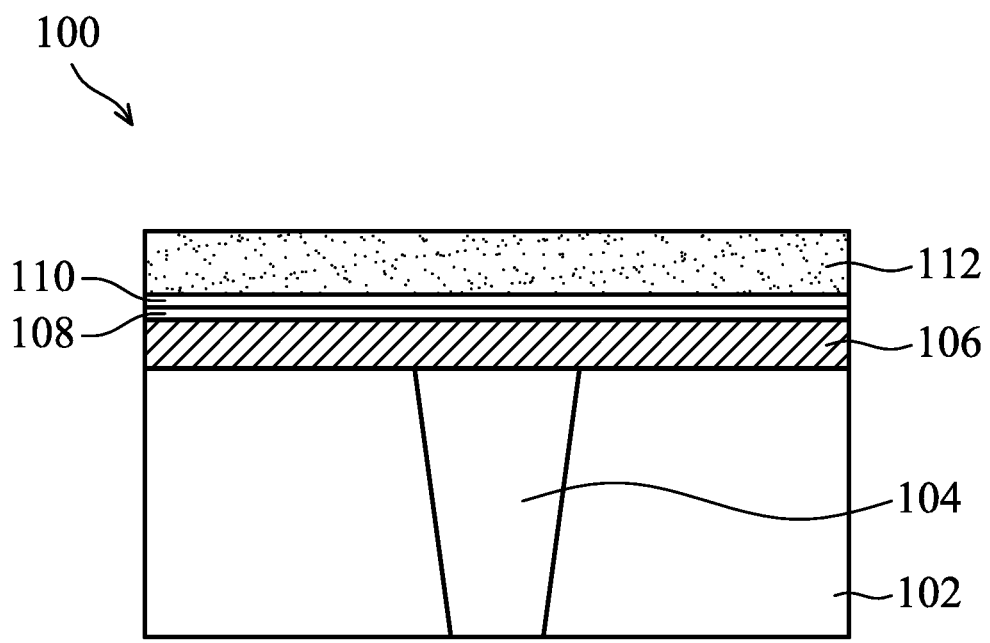
FIGS. 1A-1G are cross-sectional views illustrating various stages of manufacturing a memory device in accordance with some embodiments.

FIGS. 1A-1G are cross-sectional views illustrating various stages of manufacturing a memory device 100, in accordance with some embodiments. Referring to FIG. 1A, the memory device 100 includes an interlayer dielectric (ILD) layer 102. In some embodiments, the ILD layer 102 includes an oxide, a low-k dielectric material having a dielectric constant of less than about 3.9, or an extreme low-k (ELK) dielectric material having a dielectric constant of less than about 2, such as silicon oxynitride, phosphosilicate glass (PSG), borosilicate glass (BSG), borophosphosilicate glass (BPSG), undoped silicate glass (USG), fluorinated silicate glass (FSG), the like, or a combination thereof.

Then, a first contact plug 104 is formed in the ILD layer 102. In some embodiments, a mask layer (not illustrated) may be disposed on the ILD layer 102 and serve as an etch mask when etching an opening in the ILD layer 102. Next, the material of the first contact plug 104 is filled in the opening, and a planarization process is performed to form the first contact plug 104. For example, the mask layer may include a photoresist such as a positive photoresist or a negative photoresist. In some embodiments, the mask layer may include a hard mask and may be silicon oxide, silicon nitride, silicon oxynitride, silicon carbide, silicon carbonitride, the like, or a combination thereof. The mask layer may be a single layer or a multilayer structure. The mask layer may be formed by a deposition process, a photolithography process, and the like. The etching process may include a dry etching process, a wet etching process, or a combination thereof. The method of filling the material of the first contact plug 104 in the opening includes, for example, a physical vapor deposition (PVD) process, a chemical vapor deposition (CVD) process, an atomic layer deposition (ALD) process, evaporation, or any suitable deposition process. In some embodiments, the first contact plug 104 may include copper, aluminum, tungsten, or any suitable electrically conductive material.

Then, as illustrated in FIG. 1A, a first electrode 106, a resistive switching layer 108, a barrier layer 110, a cap layer 112 are sequentially formed on the ILD layer 102 and the first contact plug 104. The first electrode 106, the resistive switching layer 108, the barrier layer 110, and the cap layer 112 may be formed by a PVD process, a CVD process, an ALD process, evaporation, or any suitable deposition process.

In some embodiments, the first electrode 106 includes metal or metal nitride. For example, the first electrode 106 may include platinum, titanium nitride, gold, titanium, tantalum, tantalum nitride, tungsten, tungsten nitride, copper, the like, or a combination thereof, and the first electrode 106 may include a single layer or a multilayer structure. In some embodiments, the resistive switching layer 108 may include a transition metal oxide such as nickel oxide, titanium oxide, hafnium oxide, zirconium oxide, zinc oxide, tungsten oxide, aluminum oxide, tantalum oxide, molybdenum oxide, copper oxide, the like, or a combination thereof. In some embodiments, the barrier layer 110 may include silicon dioxide, silicon oxynitride, yttrium oxide, lanthanum oxide, praseodymium oxide, dysprosium oxide, tantalum oxide, aluminum oxide, hafnium oxide, titanium oxide, zirconium oxide, gadolinium oxide, cerium oxide, scandium oxide, the like, or a combination thereof. In some embodiments, the cap layer 112 may include metal or metal nitride. For example, the cap layer 112 may include platinum, titanium nitride, gold, titanium, tantalum, tantalum nitride, tungsten, tungsten nitride, copper, the like, or a combination thereof, and the cap layer 112 may include a single layer or a multilayer structure.

In particular, when a forward voltage is applied to the memory device 100, oxygen ions in the resistive switching layer 108 migrate to the electrode above it, an oxygen vacancy filament is formed in the resistive switching layer 108, and the resistive switching layer 108 is converted to a low resistance state. Conversely, when a reverse voltage is applied to the memory device 100, the oxygen ions return to the resistive switching layer 108 and combine with the oxygen vacancies in the resistive switching layer 108, causing the oxygen vacancy filament to disappear, and causing the resistive switching layer 108 to be converted to a high resistance state. The memory device 100 converts the resistance value by the above method to store or read data to achieve a memory function.

Figure 1B:
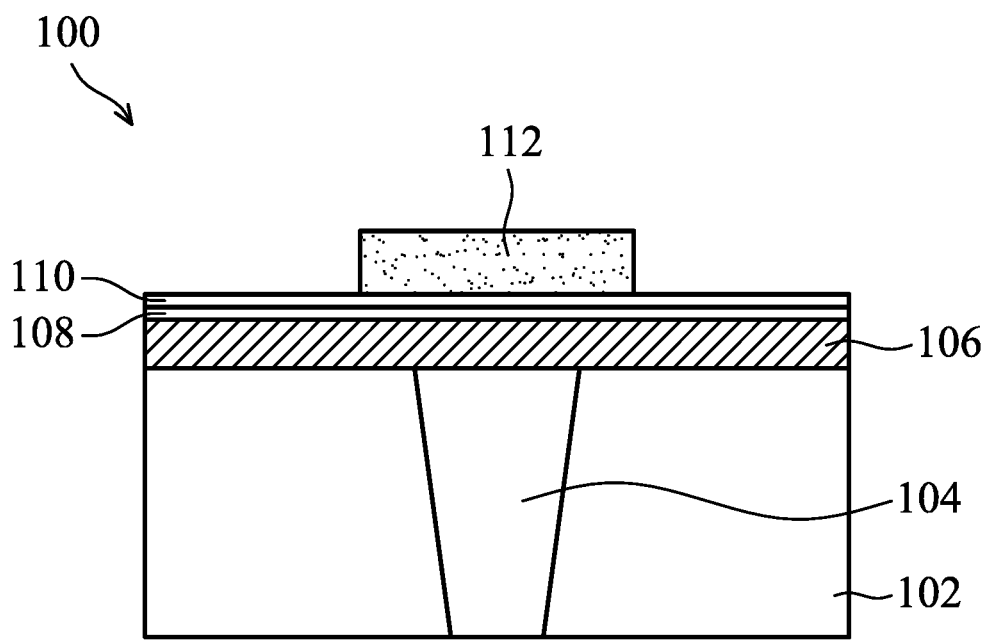

Next, as illustrated in FIG. 1B, the cap layer 112 is patterned to remove the peripheral portion of the cap layer 112. In some embodiments, a mask layer (not illustrated) may be disposed on the cap layer 112, and then an etching process is performed using the mask layer as an etch mask to form a cap layer 112 having a predetermined size. The material and formation of the mask layer and the etching process are similar to those of the mask layer used in FIG. 1A, and will not be repeated again.

In particular, the bottom surface of the cap layer 112 is smaller than the top surface of the resistive switching layer 108 after the patterning process. Since a width of the cap layer 112 is reduced, the stability of the position in which the filaments are formed can be improved, and the retention characteristics of the memory device 100 can be improved.

Figure 1C:
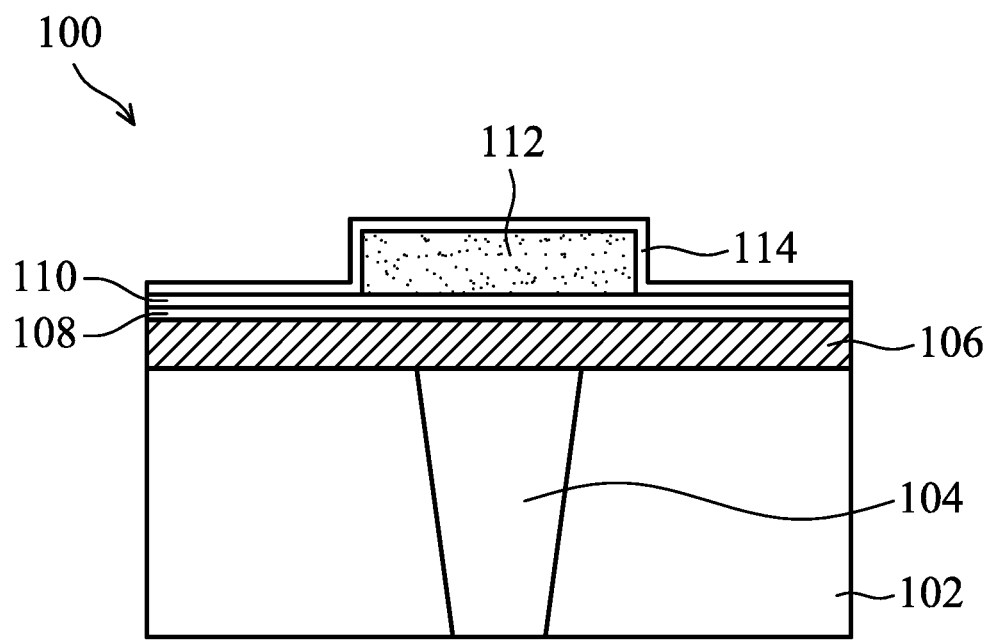

Then, as illustrated in FIG. 1C, a barrier layer 114 is conformally formed on the cap layer 112 to cover the top surface and sidewalls of the cap layer 112. The material and formation of the barrier layer 114 are similar to those of the barrier layer 110 and will not be repeated again.

Figure 1D:
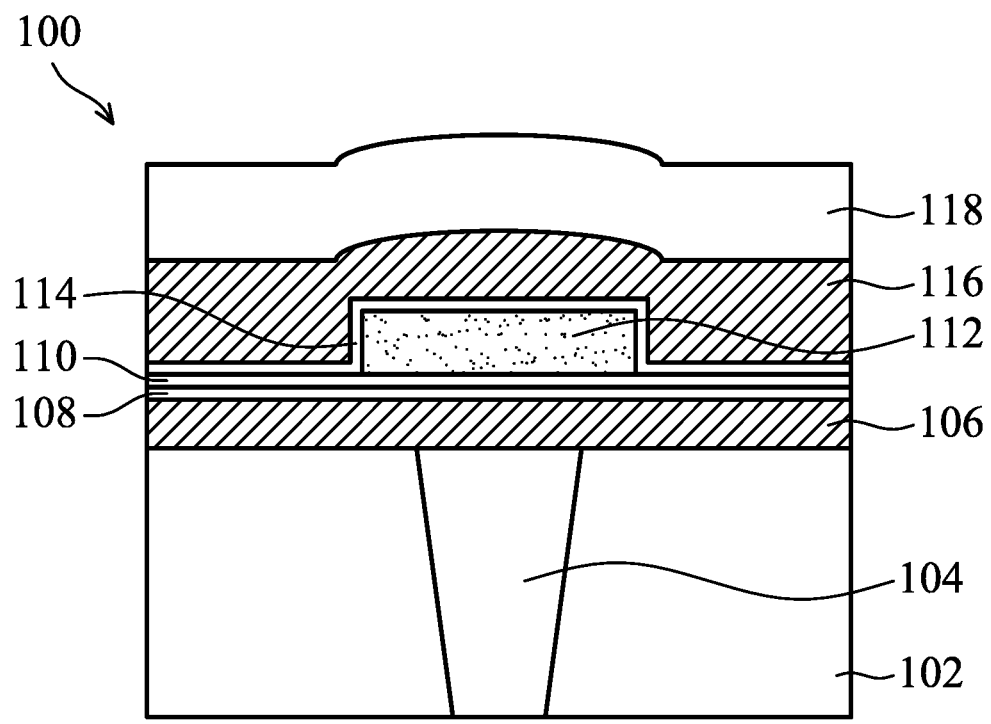

Then, as illustrated in FIG. 1D, a second electrode 116 is formed on the cap layer 112, and a mask layer 118 is formed on the second electrode 116. The material and formation of the second electrode 116 are similar to those of the first electrode 106 and will not be repeated again. The material and formation of the mask layer and the etching process are similar to those of the mask layer used in FIG. 1A, and will not be repeated again. After forming the second electrode 116, the barrier layer 114 is located between the cap layer 112 and the second electrode 116 and extends below the second electrode 116.

In particular, as illustrated in FIG. 1D, the second electrode 116 is located above the resistive switching layer 108, and a portion of the second electrode 116 surrounds the cap layer 112, which may serve as a protective layer to protect the cap layer 112 so that the cover layer 112 is not damaged by subsequent processes. For example, the material of the resistance change layer 108 is less etchable, so it is usually necessary to use a stronger etching process. If the etching process is performed while the sidewall of the cap layer 112 is exposed, the etching process easily causes damage to the cap layer 112 and forms defects. Accordingly, the second electrode 116 includes a first portion extending below the top surface of the cap layer 112 to surround the cap layer 112 and a second portion disposed over the cap layer 112 and covering the first portion, wherein the first portion separates the cap layer 112 from the location where the etching process is performed to protect the cap layer 112 from damage in the etching process.

Figure 1E:
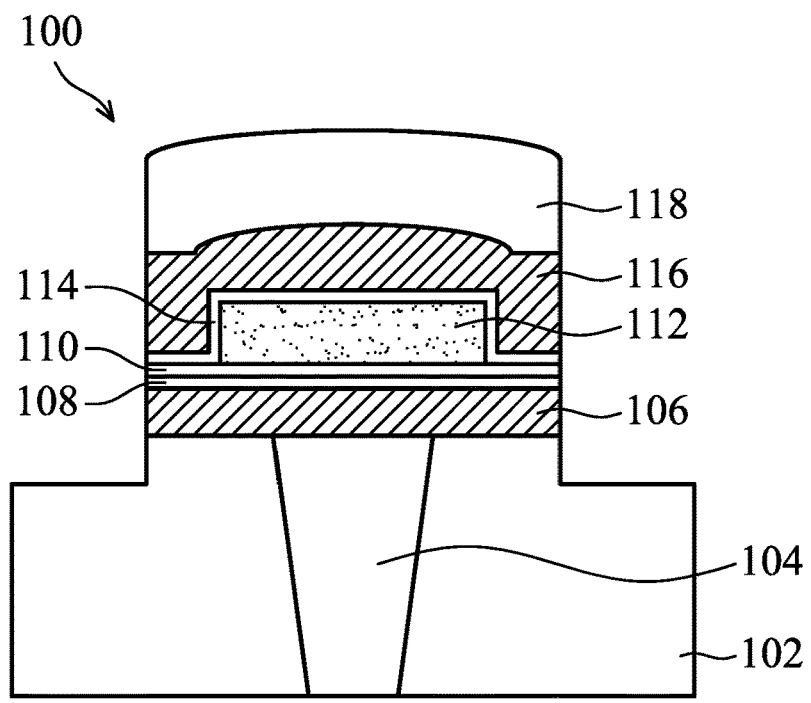

Next, referring to FIG. 1E, a photolithography process is performed to pattern the mask layer 118. Then, an etching process is performed using the patterned mask layer 118 as an etch mask, so that the sidewall of the mask layer 118, the sidewall of the second electrode 116, the sidewalls of the barrier layers 114 and 110, the sidewall of the resistive switching layer 108, the sidewall of the first electrode 106 and the sidewall of the upper portion of the ILD layer 102 are coplanar. The etching process may include a dry etching process or a wet etching process. In some embodiments, a portion of the second electrode 116 surrounds the cap layer 112 serves as a protective layer so that the sidewalls of the cap layer 112 are not damaged in the etching process.

Figure 1F:
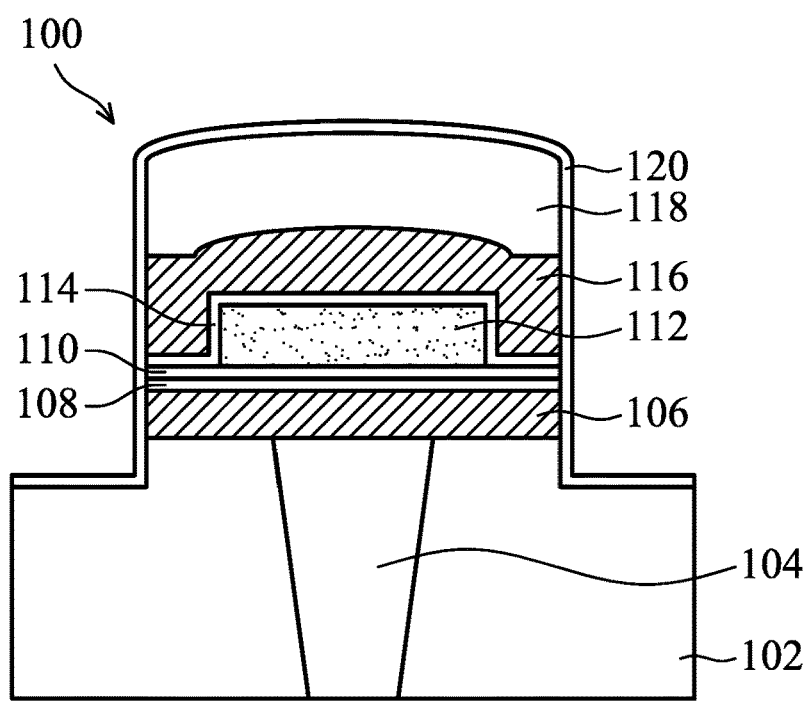

Then, as illustrated in FIG. 1F, a barrier layer 120 is conformally formed on the sidewall of the mask layer 118, the sidewall of the second electrode 116, the sidewalls of the barrier layers 114 and 110, the sidewall of the resistive switching layer 108, the sidewall of the first electrode 106, and the sidewall of the ILD layer 102. The material and formation method of the barrier layer 120 are similar to those of the barrier layer 110 and will not be repeated again.

Figure 1G:
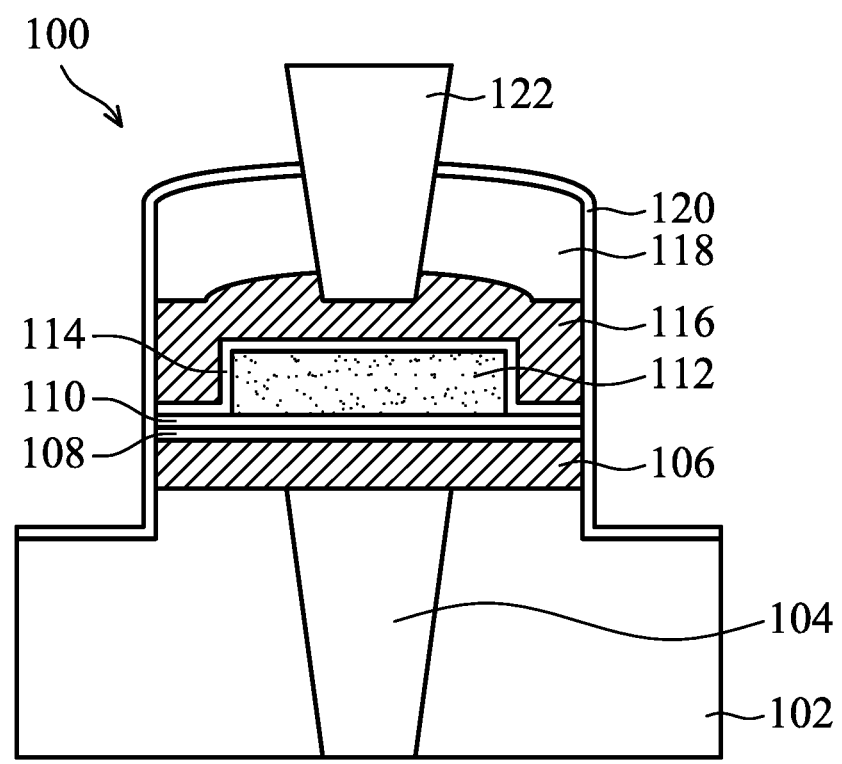

Then, as illustrated in FIG. 1G, an opening is etched through the barrier layer 120, the mask layer 118, and the second electrode 116, and then a second contact plug 122 is formed in the opening. In some embodiments, the barrier layer 120 may be covered by a mask layer (not illustrated) which exposes the predetermined position of the second contact plug 122, an etching process is performed using the mask layer as an etch mask to form the opening, and then a material of the second contact plug 122 is deposited in the opening to form the second contact plug 122. The material and formation of the mask layer and the etching process are similar to those of the mask layer used in FIG. 1A, and will not be repeated again. The material and formation of the second contact plug 122 are similar to those of the first contact plug 104 and will not be repeated again. In some embodiments, as illustrated in FIG. 1G, the second contact plug 122 passes through the barrier layer 120 and the mask layer 118 and extends into the second electrode 116 so that the bottom surface of the second contact plug 122 is located in the second electrode 116, but the present disclosure is not limited thereto, and the second contact plug 122 may have other depths.

In the present embodiment, the present disclosure provides a protective layer around the cap layer 112, wherein the protective layer includes a portion of the second electrode 116 that extends below the top surface of the cap layer 112 and surrounds the cap layer 112. This portion can be used to separate the cap layer 112 from the location where the etching process is performed, so that the cap layer 112 can be protected from damage in the etching process and the reliability of the memory device 100 can be improved. In addition, the portion of the second electrode 116 surrounding the cap layer 112 can limit the position of the filaments, thereby improving data retention of the memory device 100.

Figure 2A:
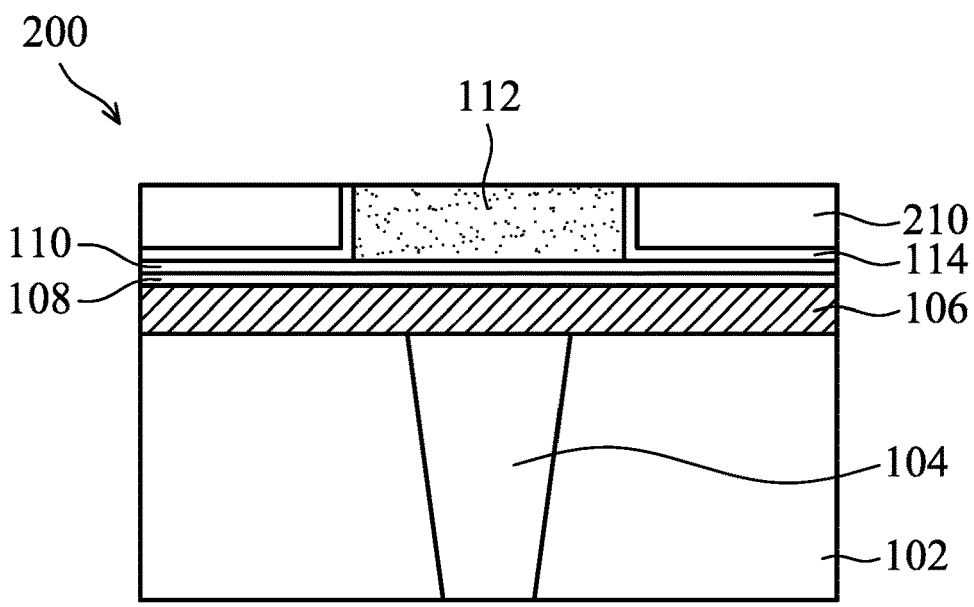
FIGS. 2A-2C are cross-sectional views illustrating various stages of manufacturing a memory device in accordance with some embodiments.
Figure 2B:
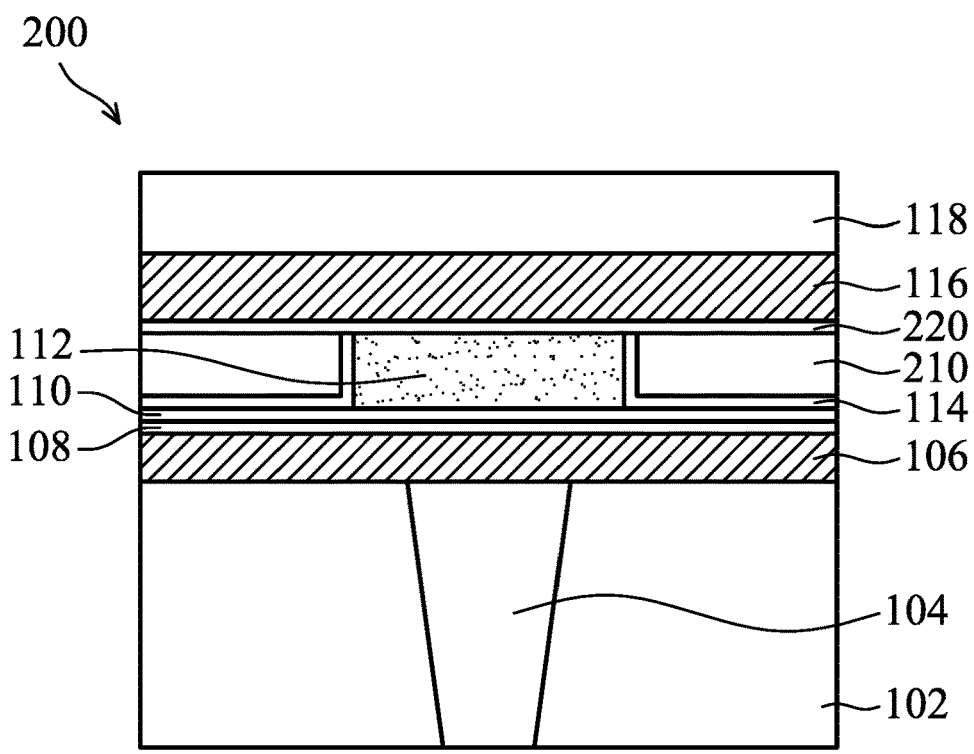
Figure 2C:
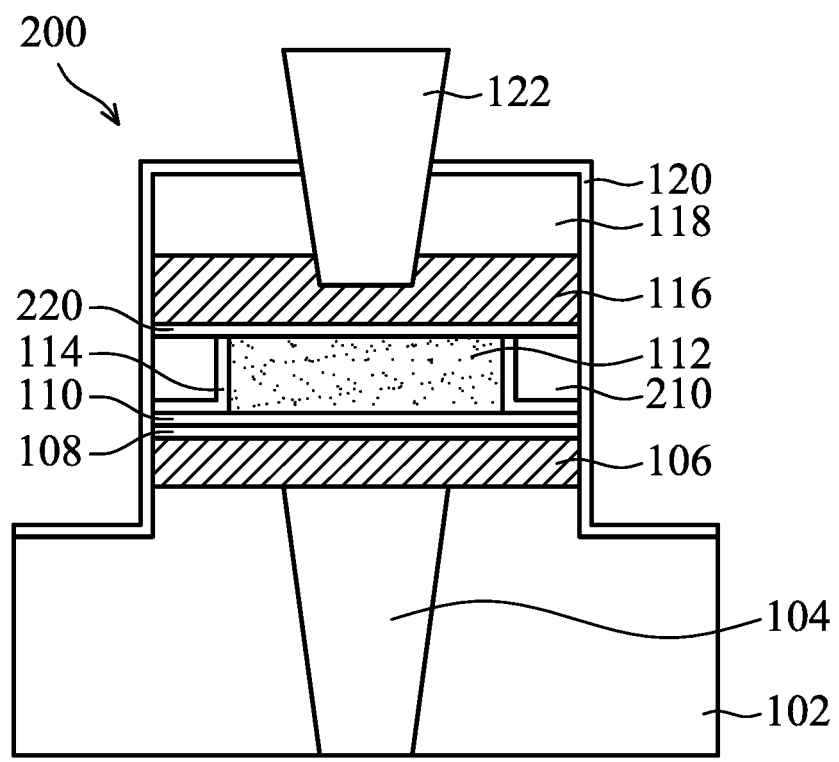

FIGS. 2A-2C are cross-sectional views illustrating various stages of manufacturing the memory device 200, in accordance with some other embodiments. FIGS. 2A-2C are subsequent to the process step in FIG. 1C, and the same reference numbers in figures are used to depict similar elements. Unless otherwise stated, the materials and formation of these elements are as described above and will not be repeated again. Different from the foregoing embodiment, the present embodiment provides a spacer as a protective layer to enhance the protection of the cap layer 112.

As illustrated in FIG. 2A, a material of a spacer 210 is formed on the barrier layer 114, and a planarization process is performed to remove the portion of the material of the spacer and the portion of the barrier layer 114 covering the top surface of the cap layer 112 to form the spacer 210. The top surface of the cap layer 112 and the top surface of the spacer 210 are coplanar. In some embodiments, the material of the spacer 210 may include a dielectric material such as silicon oxide, silicon nitride, silicon oxynitride, spin-on glass, PSG, BSG, FSG, BPSG, USG, tetraethoxysilane (TEOS), low-k dielectric material, the like, or a combination thereof. In some embodiments, the spacer 210 may be formed by CVD, ALD, spin coating, or any suitable deposition process. As illustrated in FIG. 2A, the spacer 210 surrounds the cap layer 112, and the barrier layer 114 is located between the cap layer 112 and the spacer 210 and extends below the spacer 210.

Next, referring to FIG. 2B, a barrier layer 220 is formed on the spacer 210, the barrier layer 114, and the cap layer 112. The barrier layer 220 covers the top surface of the spacer 210 and the top surface of the cap layer 112. Then, the second electrode 116 and the mask layer 118 are sequentially formed over the barrier layer 220. As illustrated in FIG. 2B, at least a portion of the second electrode 116 is disposed over the cap layer 112 and covers the spacer 210.

Next, referring to FIG. 2C, a photolithography process is performed to pattern the mask layer 118. Then, an etching process is performed using the patterned mask layer 118 as an etch mask, so that the sidewall of the mask layer 118, the sidewall of the second electrode 116, the sidewall of the spacer 210 away from the cap layer 112, the sidewalls of the barrier layers 220, 114, 110, the sidewall of the resistive switching layer 108, the sidewall of the first electrode 106, and the sidewall of the upper portion of the ILD layer 102 are coplanar. The barrier layer 120 is conformally formed on these sidewalls.

Next, referring again to FIG. 2C, an opening is etched through the barrier layer 120, the mask layer 118, and the second electrode 116, and the second contact plug 122 is formed in the opening. Herein, the method of etching the opening and the method of forming the second contact plug 122 in the opening are similar to that of FIG. 1G, and will not be repeated again.

In the present embodiment, the present disclosure provides a protective layer around the cap layer 112, wherein the protective layer includes the spacer 210 surrounding the cap layer 112 to separate the cap layer 112 from the position where the etching process is performed, so that the cap layer 112 can be protected from damage in the etching process and the reliability of the memory device 200 can be improved. In addition, the spacer 210 surrounding the cap layer 112 limits the formation position of the filaments, and improves data retention of the memory device 200. In addition, compared to a portion of the second electrode 116 as a protective layer, the spacer 210 can include a material that is less etchable, and the reliability of the memory device 200 can be further improved.

FIGS. 3A-3E are cross-sectional views illustrating various stages of manufacturing the memory device 300, in accordance with some other embodiments. FIGS. 3A-3E are similar to the embodiments illustrated in FIGS. 1A-1C and 2A-2C, except that the spacer 210 as protective layers are formed in different process sequences. The same reference numbers in figures are used to depict similar elements. Unless otherwise stated, the materials and formation of these elements are as described above and will not be repeated again.

Figure 3A:
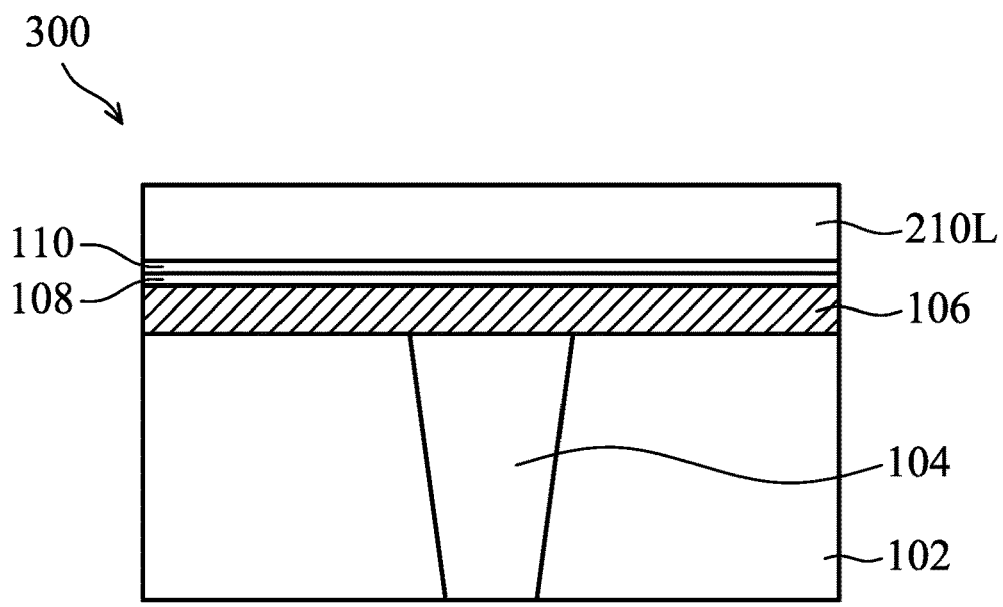
FIGS. 3A-3E are cross-sectional views illustrating various stages of manufacturing a memory device in accordance with some embodiments.

In the present embodiment, as illustrated in FIG. 3A, a spacer layer 210L is formed on the barrier layer 110. The spacer layer 210L may be formed by CVD, ALD, spin coating, or any suitable deposition process. The material of the spacer layer 210L is the same as that of the spacer 210 of the foregoing embodiment, and will not be repeated again.

Figure 3B:
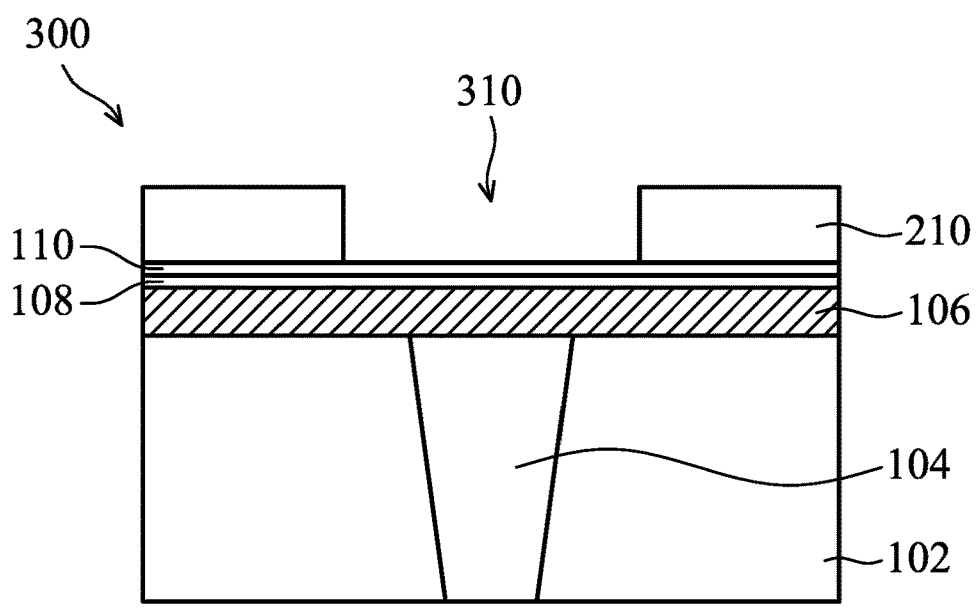

Then, as illustrated in FIG. 3B, an opening 310 is etched through the spacer layer 210L. After the opening 310 is formed, the spacer layer 210L forms into the spacer 210. The position of the opening 310 corresponds to the position at which the cap layer 112 is subsequently formed. In some embodiments, the spacer layer 210L may be covered by a mask layer (not illustrated) which exposes the predetermined position of the opening 310, and then an etching process may be performed using the mask layer as an etch mask to form the opening 310.

Figure 3C:
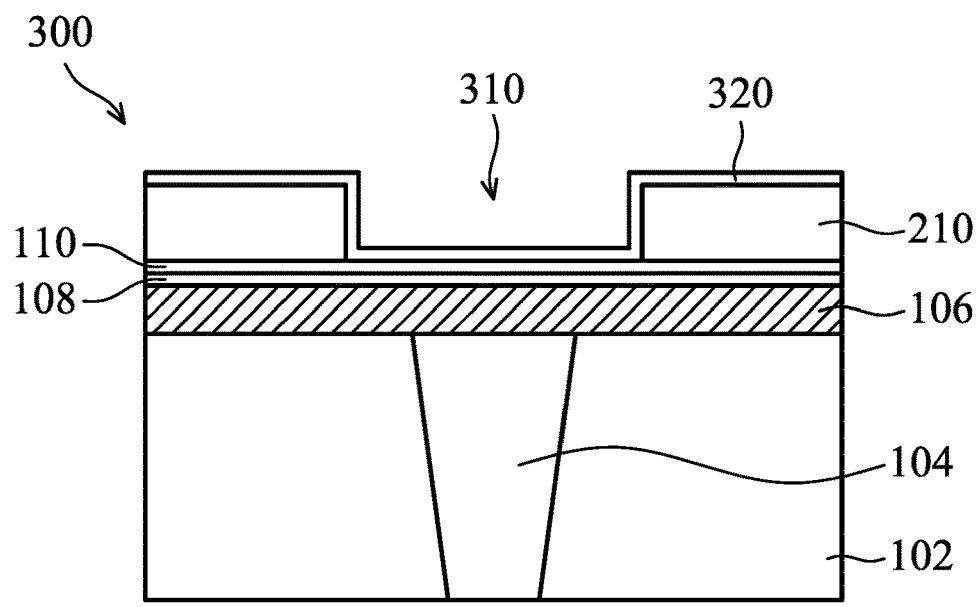
Figure 3D:
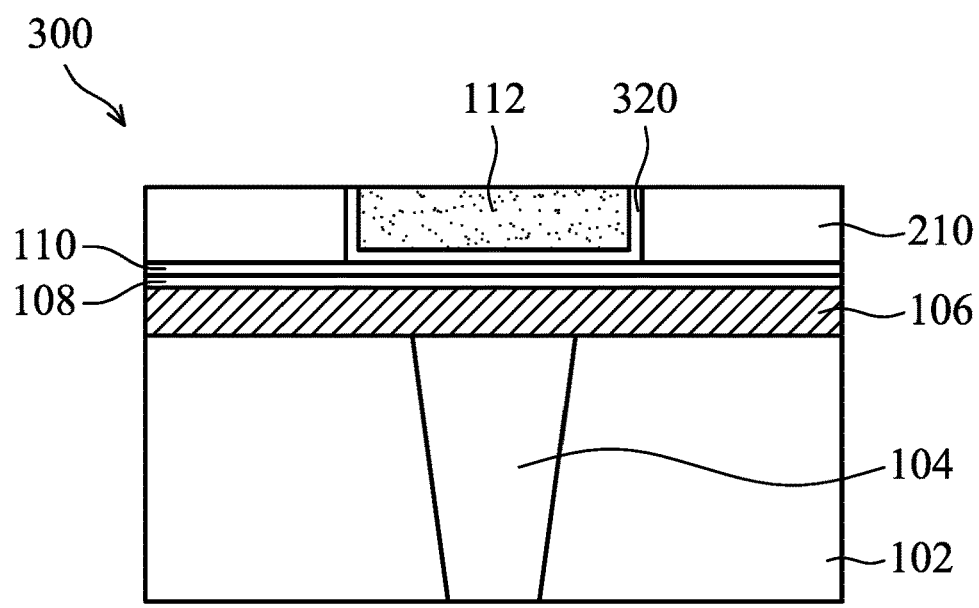

Next, as illustrated in FIG. 3C, a barrier layer 320 is conformally formed on the spacer layer 210 and in the opening 310. Then, referring to FIG. 3D, a cap layer 112 is formed on the barrier layer 320, and a planarization process is performed so that the top surfaces of the spacer layer 210, the barrier layer 320, and the cap layer 112 are coplanar. As illustrated in FIG. 3D, the barrier layer 320 of the present embodiment is located between the cap layer 112 and the protective layer 210, and the barrier layer 320 extends below the cap layer 112.

Figure 3E:
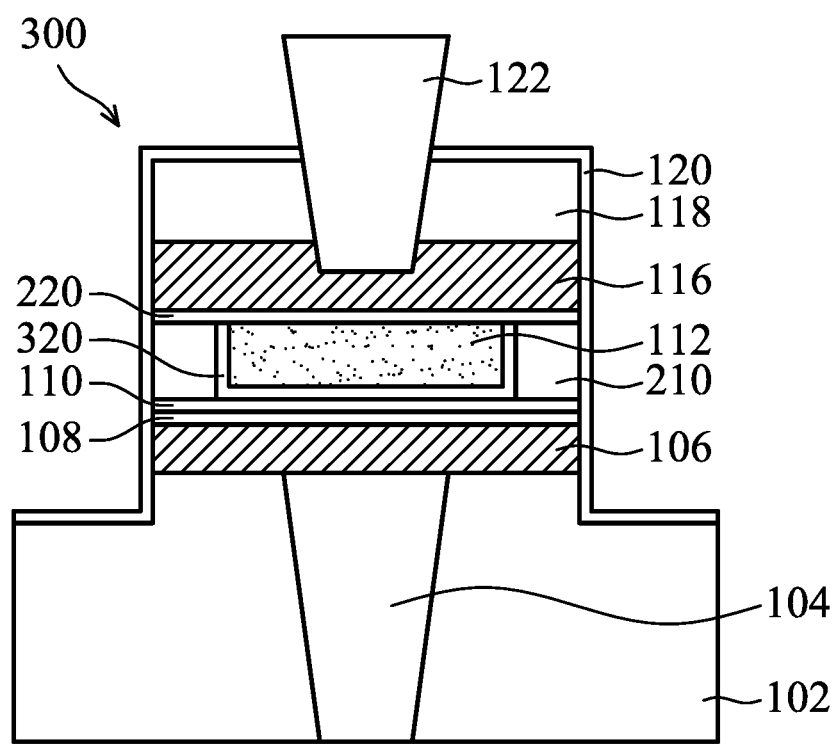

Then, referring to FIG. 3E, a barrier layer 220, a second electrode 116, and a mask layer 118 are sequentially formed over the spacer 210, the barrier layer 320, and the cap layer 112. Then, similar to FIG. 2C, a photolithography and an etching process are performed so that the sidewall of the mask layer 118, the sidewall of the second electrode 116, the sidewall of the spacer layer 210 away from the cap layer 112, the sidewalls of the barrier layers 220 and 110, and the sidewall of the resistive switching layer 108, the sidewall of the first electrode 106, and the sidewall of the upper portion of the ILD layer 102 are coplanar, and the barrier layer 120 is conformally formed thereon.

Next, referring again to FIG. 3E, an opening is etched through the barrier layer 120, the mask layer 118, and the second electrode 116, and the second contact plug 122 is formed in the opening. Herein, the method of etching the opening and the method of forming the second contact plug 122 in the opening are similar to that of FIG. 1G, and will not be repeated again.

In the present embodiment, the present disclosure provides a protective layer around the cap layer 112, wherein the protective layer includes a spacer 210 that surrounds the cap layer 112 to separate the cap layer 112 from the position where the etching process is performed, so that the cap layer 112 can be protected from damage in the etching process and the reliability of the memory device 300 can be improved. Compared to a portion of the second electrode 116 as a protective layer, the spacer 210 can include a material that is less etchable, and the reliability of the memory device 300 can be further improved.

In summary, the present disclosure provides a protective layer surrounding the cap layer in the memory device, and the protective layer can be used to separate the cap layer from the position where the etching process is performed, so that the cap layer can be protected from damage in subsequent processes and the reliability of the memory device can be improved. In addition, according to some embodiments, the protective layer surrounding the cap layer can limit the formation position of the filaments, the stability of the position of the filament can be improved, thereby improving the data retention of the memory device.

In embodiments in which the protective layer includes a portion of the second electrode, fewer process steps are required compared to a spacer as the protective layer. In embodiments in which the protective layer includes a spacer, the spacer can include a material that is less etchable compared to a portion of the second electrode as the protective layer, which reduces the possibility of the cap layer being etched, thereby improving the reliability of the memory device.

Although the present disclosure has been described above by various embodiments, these embodiments are not intended to limit the disclosure. Those skilled in the art should appreciate that they may make various changes, substitutions and alterations without departing from the spirit and scope of the disclosure. Therefore, the scope of protection of the present disclosure is defined as the subject matter set forth in the appended claims.

What is claimed is:

1. A memory device, comprising:
   a resistive switching layer disposed over a first electrode;
   a cap layer disposed over the resistive switching layer, wherein a bottom surface of the cap layer is smaller than a top surface of the resistive switching layer;
   a protective layer disposed over the resistive switching layer and surrounding the cap layer;
   a second electrode, at least a portion of which is disposed over the cap layer, and the second electrode covering the protective layer; and
   a mask layer disposed over the second electrode, wherein a sidewall of the mask layer is coplanar with a sidewall of the protective layer.

2. The memory device as claimed in claim 1, wherein a material of the protective layer is the same as a material of the second electrode.

3. The memory device as claimed in claim 1, wherein the protective layer comprises a spacer which comprises a dielectric material.

4. The memory device as claimed in claim 1, wherein the sidewall of the protective layer away from the cap layer is coplanar with a sidewall of the second electrode and a sidewall of the first electrode.

5. The memory device as claimed in claim 4, wherein the sidewall of the protective layer is coplanar with a sidewall of the resistive switching layer.

6. The memory device as claimed in claim 1, further comprising a barrier layer disposed between the cap layer and the protective layer.

7. The memory device as claimed in claim 6, wherein the barrier layer extends below the cap layer.

8. The memory device as claimed in claim 6, wherein the barrier layer extends below the protective layer.

9. The memory device as claimed in claim 8, wherein the barrier layer covers a top surface of the cap layer.

10. The memory device as claimed in claim 1, wherein the cap layer comprises metal, metal nitride, or a combination thereof.

11. A method of forming the memory device as set forth in claim 1, comprising:
    forming a first electrode;
    forming a resistive switching layer over the first electrode;
    forming a cap layer over the resistive switching layer, wherein a bottom surface of the cap layer is smaller than a top surface of the resistive switching layer;
    forming a protective layer over the resistive switching layer, wherein the protective layer surrounds the cap layer;
    forming a second electrode over the cap layer, wherein the second electrode covers the protective layer;
    forming a mask layer over the second electrode; and
    performing an etching process using the mask layer as an etch mask so that sidewalls of the first electrode, the resistive switching layer, the cap layer, the protective layer, the second electrode and the mask layer are coplanar.

12. The method as claimed in claim 11, wherein the protective layer comprises a portion of the second electrode, and forming the portion of the second electrode comprises:
    after forming the cap layer, removing a peripheral portion of the cap layer; and
    forming the second electrode over the cap layer, wherein the portion of the second electrode extends below the cap layer to surround the cap layer.

13. The method as claimed in claim 12, further comprising:
    after removing the peripheral portion of the cap layer, conformally forming a barrier layer on the cap layer and the resistive switching layer; and
    after forming the second electrode, the barrier layer located between the cap layer and the second electrode.

14. The method as claimed in claim 11, wherein the protective layer comprises a spacer, wherein the spacer comprises a dielectric material, and forming the spacer comprises:
    after forming the cap layer, removing a peripheral portion of the cap layer;
    forming the spacer over the resistive switching layer, wherein the spacer surrounds the cap layer; and
    performing a planarization process so that a top surface of the cap layer is coplanar with a top surface of the spacer.

15. The method as claimed in claim 14, further comprising:
    after removing the peripheral portion of the cap layer, conformally forming a barrier layer on the cap layer and the resistive switching layer; and
    after forming the spacer, the barrier layer located between the cap layer and the spacer.

16. The method as claimed in claim 11, wherein the protective layer comprises a spacer, wherein the spacer comprises a dielectric material, and forming the spacer comprises:
    forming the spacer over the resistive switching layer;
    removing a portion of the spacer to form an opening;
    forming the cap layer in the opening; and
    performing a planarization process so that a top surface of the cap layer is coplanar with a top surface of the spacer.

17. The method as claimed in claim 16, further comprising:
    after removing the opening, conformally forming a barrier layer in the opening and on the spacer; and forming the cap layer in the remaining portion of the opening, wherein the barrier layer is located between the cap layer and the spacer.

18. The method as claimed in claim 11, wherein the cap layer comprises metal, metal nitride, or a combination thereof.

19. The method as claimed in claim 11, further comprising forming a barrier layer on the sidewalls of the first electrode, the resistive switching layer, the cap layer, the protective layer, the second electrode and the mask layer.

* * * * *